United States Patent
Lee (10) Patent No.: US 9,997,257 B1
(45) Date of Patent: Jun. 12, 2018

(54) SEMICONDUCTOR DEVICE AND SEMICONDUCTOR SYSTEM INCLUDING THE SAME

(71) Applicant: SK hynix Inc., Icheon-si, Gyeonggi-do (KR)

(72) Inventor: Jung Hwan Lee, Guri-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/634,543

(22) Filed: Jun. 27, 2017

(30) Foreign Application Priority Data

Dec. 13, 2016 (KR) .................... 10-2016-0169704

(51) Int. Cl.
G11C 7/00 (2006.01)
G11C 29/00 (2006.01)
G11C 8/10 (2006.01)
G11C 8/12 (2006.01)

(52) U.S. Cl.
CPC .............. G11C 29/76 (2013.01); G11C 8/10 (2013.01); G11C 8/12 (2013.01)

(58) Field of Classification Search
CPC ......... G11C 29/76; G11C 29/44; G11C 29/72; G11C 29/04; G11C 11/4085; G11C 29/789; G11C 8/10; G11C 8/12
USPC .... 365/200, 189.05, 185.09, 189.07, 185.08, 365/225.7
See application file for complete search history.

(56) References Cited

U.S. PATENT DOCUMENTS

| | | | |
|---|---|---|---|
| 9,230,693 B1 | 1/2016 | Lee | |
| 2002/0133770 A1* | 9/2002 | Cowles | G11C 29/44 714/723 |
| 2007/0033449 A1* | 2/2007 | Hwang | G11C 29/02 714/710 |
| 2012/0257462 A1* | 10/2012 | Cho | G11C 29/44 365/189.07 |
| 2016/0078968 A1 | 3/2016 | Park et al. | |
| 2016/0284422 A9* | 9/2016 | Ong | G11C 29/12 |

FOREIGN PATENT DOCUMENTS

KR 1020160030717 A 3/2016
KR 1020160069222 A 6/2016

* cited by examiner

*Primary Examiner* — Gene Auduong
(74) *Attorney, Agent, or Firm* — William Park & Associates Ltd.

(57) ABSTRACT

A semiconductor device may include a repair address storage circuit, an address comparison circuit, and a word line selection circuit. The repair address storage circuit may store a first repair address and a second repair address. The address comparison circuit may generate a first comparison signal by comparing an input address and the first repair address, and may generate a second comparison signal by comparing the input address and the second repair address. The word line selection circuit may generate a first redundancy word line select signal corresponding to the first comparison signal and a second redundancy word line select signal corresponding to the second comparison signal, based on the first comparison signal and the second comparison signal.

20 Claims, 5 Drawing Sheets

| sPPR_ADD | FSEN_0 | ~100_0 |

| NOR_REP_ADD_1 | FSEN_1 | ~100_1 |

| NOR_REP_ADD_2 | FSEN_2 | ~100_2 |

⁎
⁎
⁎

| NOR_REP_ADD_N | FSEN_N | ~100_N |

SEMICONDUCTOR DEVICE AND SEMICONDUCTOR SYSTEM INCLUDING THE SAME

CROSS-REFERENCES TO RELATED APPLICATION

The present application claims priority under 35 U.S.C. § 119(a) to Korean Patent Application number 10-2016-0169704 filed on Dec. 13, 2016, in the Korean Intellectual Property Office, which is incorporated herein by reference in its entirety.

BACKGROUND

1. Technical Field

Various embodiments generally relate to a semiconductor device and a semiconductor system including the same, and, more particularly, to a semiconductor device and a semiconductor system that may select one repair address in the case where at least two repair addresses corresponding to one input address exist.

2. Related Art

A semiconductor device may include a huge number of memory cells. The development of fabrication technologies has made possible to integrate a large number of memory cells into a semiconductor device. If the semiconductor device has defective memory cells, however, it may malfunction. Even if the semiconductor device includes only one defective memory cell, the semiconductor device may possibly malfunction.

These days, semiconductor devices usually include redundancy memory cells therein. If only a small number of memory cells are found to be defective through a test, the defective memory cells are replaced with the redundancy memory cells, instead of discarding the semiconductor devices, to achieve profitable yield levels.

In this regard, a redundancy control circuit may be used to remap addresses of defective memory cells to addresses of other memory cells when an access to the defective memory cell is requested. For example, the semiconductor device may be repaired by remapping addresses of defective memory cells (hereinafter, referred to as a "failed cell") to addresses of redundancy memory cells.

If an access is attempted to the failed cell during a read/write operation, a normal memory cell is accessed, instead of the failed cell, by remapping the address of the failed cell to the address of the normal memory cell. Here, the normal memory cell may be a redundancy memory cell.

Therefore, even if a memory cell corresponding to an input address is a failed cell, a semiconductor device may operate properly by repairing the failed cell (hereinafter, referred to as a "repair operation").

In order to perform a repair operation, a semiconductor device includes a nonvolatile memory circuit, and the address of a failed cell (hereinafter, referred to as "repair address") is stored in the nonvolatile memory circuit. Here, examples of the nonvolatile memory circuit may include an e-fuse array circuit, a NAND flash memory, a NOR flash memory, a magnetic random access memory (MRAM), a spin transfer torque magnetic random access memory (STT-MRAM), a resistive random access memory (ReRAM), and a phase change random access memory (PCRAM).

If a repair address is stored only once in a nonvolatile memory, only one redundancy address can exist per repair address.

However, repair addresses may be stored multiple times, and thus the same repair address may possibly be stored in different locations. In this case, since at least two redundancy addresses exist for the same repair address, an address collision may occur.

SUMMARY

In an embodiment, a semiconductor device may include a repair address storage circuit, an address comparison circuit, and a word line selection circuit. The repair address storage circuit may store a first repair address and a second repair address. The address comparison circuit may generate a first comparison signal by comparing an input address and the first repair address, and generating a second comparison signal by comparing the input address and the second repair address. The word line selection circuit may generate a first redundancy word line select signal corresponding to the first comparison signal and a second redundancy word line select signal corresponding to the second comparison signal, based on the first comparison signal and the second comparison signal.

In an embodiment, a semiconductor system may include a controller and a semiconductor device. The semiconductor device may generate a first redundancy word line select signal corresponding to a first repair address, which is provided to the semiconductor device, and a second redundancy word line select signal corresponding to a second repair address, which is recorded in the semiconductor device, based on a result of comparing an input address with each of the first repair address and the second repair address. The controller may store the first repair address in the semiconductor device.

DETAILED DESCRIPTION

Hereinafter, a semiconductor device and a semiconductor system including the same will be described below with reference to the accompanying drawings through various examples of embodiments.

Figure 1:
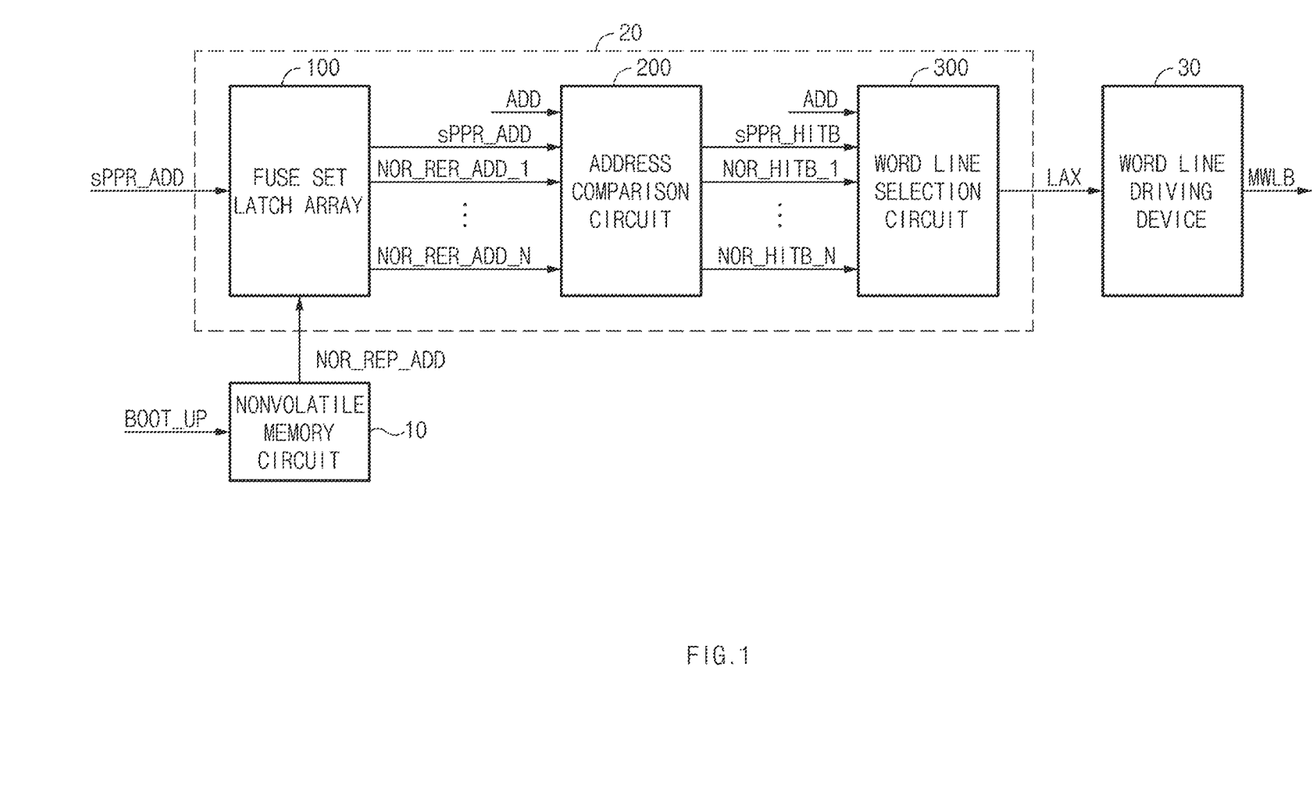
FIG. 1 is a configuration diagram illustrating an example of a semiconductor device in accordance with an embodiment.

FIG. 1 is a configuration diagram illustrating an example of a semiconductor device 1 in accordance with an embodiment.

Referring to FIG. 1, the semiconductor device 1 includes a nonvolatile memory circuit 10, a repair control device 20, and a word line driving device 30.

In the nonvolatile memory circuit 10, there is stored such information as an internal power value of the semiconductor device 1, an initial value of an internal signal, and a repair address NOR_REP_ADD. In the present specification, the repair address NOR_REP_ADD transmitted from the nonvolatile memory circuit 10 is referred to as a "normal repair address" to distinguish it from an sPPR address sPPR_ADD. Also, the normal repair address NOR_REP_ADD and the sPPR address sPPR_ADD are collectively referred to as a repair address REP_ADD.

The normal repair address NOR_REP_ADD stored in the nonvolatile memory circuit 10 is moved to a repair address storage circuit (e.g., a fuse set latch array 100 of the repair control device 20) in response to a boot-up signal BOOT_UP. The normal repair address NOR_REP_ADD represents a plurality of normal repair addresses NOR_REP_ADD_1 to NOR_REP_ADD_N. The boot-up signal BOOT_UP may be activated automatically after a predetermined period of time from a power-up of the semiconductor device 1, or may be activated under an instruction of a controller (not illustrated). The controller, which is a circuit or a device capable of controlling the semiconductor device 1, may be, for example, a central processing unit (CPU), an application processor (AP), or a memory controller.

The repair control device 20 may include the fuse set latch array 100, an address comparison circuit 200, and a word line selection circuit 300.

A plurality of repair addresses REP_ADD may be stored in the fuse set latch array 100. The repair address REP_ADD stored in the fuse set latch array 100 includes the normal repair address NOR_REP_ADD, which is transmitted from the nonvolatile memory circuit 10 as described above, and the sPPR address sPPR_ADD, which is transmitted through a path other than the nonvolatile memory circuit 10.

In an embodiment, a post package repair feature may be provided to repair defective memory cells by remapping addresses of defective memory cells to addresses of redundancy memory cells. A soft post package repair (sPPR) feature may include a step of transmitting the sPPR address sPPR_ADD through a path other than the nonvolatile memory circuit 10. In general, the normal repair address NOR_REP_ADD of a failed memory cell detected through a test in the manufacturing procedure of the semiconductor device 1 is stored in the nonvolatile memory circuit 10. However, defective memory cells may be detected not only before packaging (e.g., wafer level) but also after packaging.

The soft post package repair may include a step of storing the sPPR address sPPR_ADD directly in the fuse set latch array 100 in which repair addresses are stored, after the packaging of the semiconductor device 1. Because the sPPR address sPPR_ADD is stored in the fuse set latch array 100, instead of the nonvolatile memory circuit 10, if power supply to the semiconductor device 1 is interrupted, the semiconductor device 1 loses the sPPR address sPPR_ADD stored in the fuse set latch array 100. In this sense, the repair method discussed above is referred to as the "soft" post package repair scheme.

For example, a soft post package repair operation may be performed by storing the sPPR address sPPR_ADD at a certain position of the fuse set latch array 100 through using a mode register command.

Mode registers for defining operation modes are provided in the semiconductor device 1, and setting the values of the mode registers is referred to as mode register set. A mode register set command is issued for a memory device such as a synchronous dynamic random access memory (SDRAM) or a static random access memory (SRAM) to set operating parameters such as a burst type, a burst length (BL), a CAS latency (column address strobe latency: CL), and a read latency (RL). The mode register set may be performed under a test mode for a vendor to inspect a chip, or may be performed under a mode that provides operation mode setting by a user in the JEDEC (Joint Electron Device Engineering Council) specification. The mode register set command is executed by applying a certain address together with a mode register command. The soft post package repair operation may be performed by using a mode register command.

Because the normal repair address NOR_REP_ADD stored through the nonvolatile memory circuit 10 and the sPPR address sPPR_ADD stored by the soft post package repair operation are different in their storage paths, if the normal repair address NOR_REP_ADD and the sPPR address sPPR_ADD are the same as each other, two redundancy word lines corresponding to the normal repair address NOR_REP_ADD and the sPPR address sPPR_ADD may be activated at the same time.

In this case, the address comparison circuit 200 and the word line selection circuit 300 activate preferentially any one of the redundancy word line corresponding to the normal repair address NOR_REP_ADD and the redundancy word line corresponding to the sPPR address sPPR_ADD. For example, the redundancy word line corresponding to the sPPR address sPPR_ADD may take priority over the redundancy word line corresponding to the normal repair address NOR_REP_ADD.

The address comparison circuit 200 compares an input address ADD with each of the repair addresses sPPR_ADD and NOR_REP_ADD_1 to NOR_REP_ADD_N stored in the fuse set latch array 100, and generates an sPPR comparison signal sPPR_HITB and normal comparison signals NOR_HITB_1 to NOR_HITB_N corresponding to the repair addresses sPPR_ADD and NOR_REP_ADD_1 to NOR_REP_ADD_N, respectively. In the following descriptions, the sPPR comparison signal sPPR_HITB and the normal comparison signals NOR_HITB_1 to NOR_HITB_N may be collectively referred to as a comparison signal HITB.

The word line selection circuit 300 activates a word line select signal LAX based on the sPPR comparison signal sPPR_HITB and the normal comparison signals NOR_HITB_1 to NOR_HITB_N. While only one word line select signal LAX is illustrated in FIG. 1, it is to be noted that a plurality of word line select signals LAX may exist for normal word lines and redundancy word lines, respectively.

In the case where the sPPR comparison signal sPPR_HITB and at least one of the normal comparison signals NOR_HITB_1 to NOR_HITB_N are activated simultaneously, that is, in the case where the sPPR address sPPR_ADD and at least one of the normal repair addresses NOR_REP_ADD_1 to NOR_REP_ADD_N are stored as the same value in the fuse set latch array 100, if an input address ADD is the same as the normal repair address NOR_REP_ADD and the sPPR address sPPR_ADD, the word line selection circuit 300 activates only the word line select signal LAX corresponding to the sPPR comparison signal sPPR_HITB and deactivates the word line select signal LAX corresponding to the normal comparison signal NOR_HITB. Therefore, in the case where the normal repair address NOR_REP_ADD and the sPPR address sPPR_ADD stored in the fuse set latch array 100 are the same, it is possible to prevent two or more word lines from being activated at the same time by activating the redundancy word line corresponding to the sPPR address sPPR_ADD only.

In the present embodiment, it was described that, in the case where the sPPR address sPPR_ADD and at least one of the normal repair addresses NOR_REP_ADD_1 to NOR- _REP_ADD_N stored in the fuse set latch array 100 are the same, the redundancy word line corresponding to the sPPR address sPPR_ADD takes priority over the redundancy word line corresponding to the normal repair address NOR_REP_ADD. However, the present embodiment is not limited thereto, and it is to be noted that the redundancy word line corresponding to at least one of the normal repair addresses NOR_REP_ADD_1 to NOR_REP_ADD_N may take priority over the redundancy word line corresponding to the sPPR address sPPR_ADD.

The word line selection circuit 300 may activate the word line select signal LAX corresponding to the input address ADD, in the case where both the normal comparison signal NOR_HITB and the sPPR comparison signal sPPR_HITB are not activated.

The word line driving device 30 activates a word line driving signal MWLB corresponding to the redundancy word line select signal or normal word line select signal LAX generated by the repair control device 20, in response to the redundancy word line select signal or normal word line select signal LAX.

Figure 2:
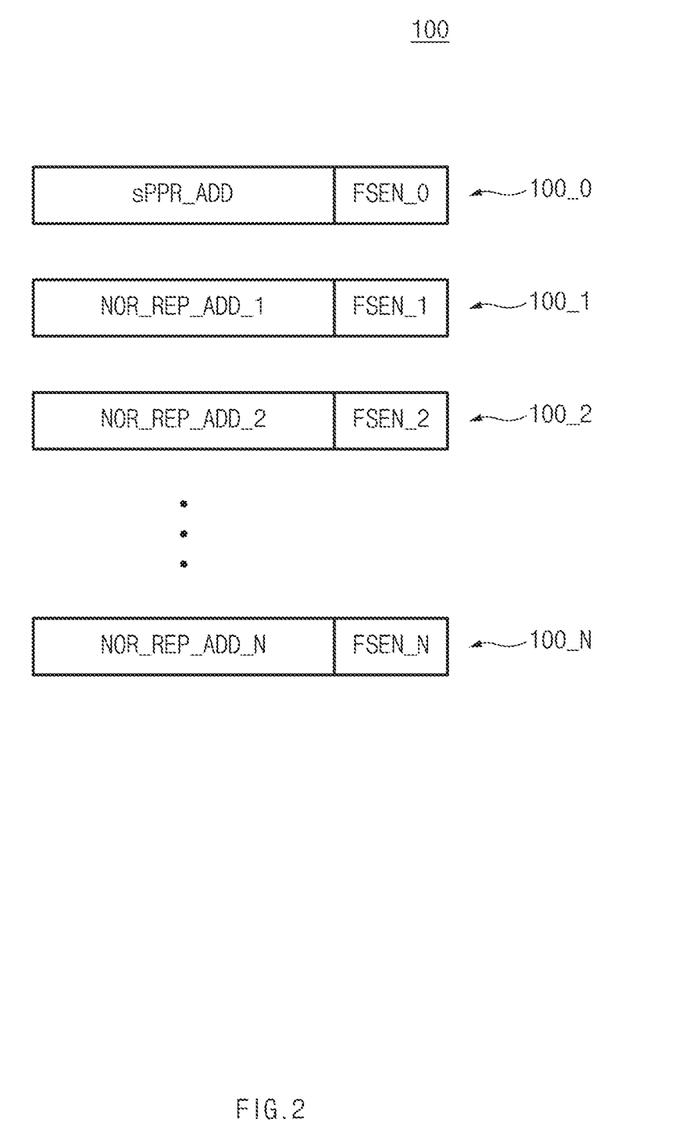
FIG. 2 is a configuration diagram illustrating an example of the fuse set latch array shown in FIG. 1.

FIG. 2 is a configuration diagram illustrating an example of the fuse set latch array 100 shown in FIG. 1.

Referring to FIG. 2, the fuse set latch array 100 includes a plurality of fuse set latches 100_0 to 100_N. The repair address REP_ADD is stored in each of the fuse set latches 100_0 to 100_N. For example, the sPPR address sPPR_ADD is stored in the zeroth fuse set latch 100_0, and the normal repair addresses NOR_REP_ADD_1 to NOR_REP_ADD_N may be stored in the first to N^th fuse set latches 100_1 to 100_N, respectively.

Fuse set enable signals FSEN (e.g., FSEN_0 to FSEN_N), which represent whether the repair addresses sPPR_ADD and NOR_REP_ADD_1 to NOR_REP_ADD_N stored in the respective fuse set latches 100_0 to 100_N are valid or not, may be stored in the respective fuse set latches 100_0 to 100_N. The fuse set enable signal FSEN stored in the nonvolatile memory circuit 10 may be provided to the fuse set latch array 100. The nonvolatile memory circuit 10 is set to a certain value, for example, "0," at an initial state in which information is not stored. In this case, if data of "0" is recorded in the nonvolatile memory circuit 10, it is not possible to distinguish whether information is not stored yet in the nonvolatile memory circuit 10 or data of "0" is recorded in the nonvolatile memory circuit 10. Therefore, by setting the fuse set enable signal FSEN to a certain value (e.g., "1") that is distinguishable from the data of "0" to be recorded, it is possible to represent a state in which information is stored. The nonvolatile memory circuit 10 may be a fuse set array that has the same structure as the fuse set latch array 100 and includes a plurality of fuse sets. In this case, in order to represent whether information is stored or not in each fuse set, the fuse set enable signal FSEN may be set to a certain value. The fuse set enable signals FSEN_1 to FSEN_N of the fuse set latch array 100 may be transmitted and stored together with the normal repair addresses NOR_REP_ADD_1 to NOR_REP_ADD_N, when information is transmitted from the nonvolatile memory circuit 10 in response to the boot-up signal BOOT_UP. Also, the fuse set enable signal FSEN_0 of the fuse set latch array 100 may be transmitted and stored together with the sPPR address sPPR_ADD in the soft post package repair operation.

It is illustrated in FIG. 2 that the sPPR address sPPR_ADD is stored in the zeroth fuse set latch 100_0 and the normal repair addresses NOR_REP_ADD_1 to NOR_REP_ADD_N are stored in the first to N^th fuse set latches 100_1 to 100_N, respectively. However, the present embodiment is not limited thereto, and it is to be noted that the sPPR address sPPR_ADD may be stored at an any fuse set latch among the plurality of fuse set latches 100_1 to 100_N. Further, while it is illustrated in FIG. 2 that one sPPR address sPPR_ADD is stored, it is to be noted that a plurality of sPPR addresses sPPR_ADD may be stored.

Figure 3:
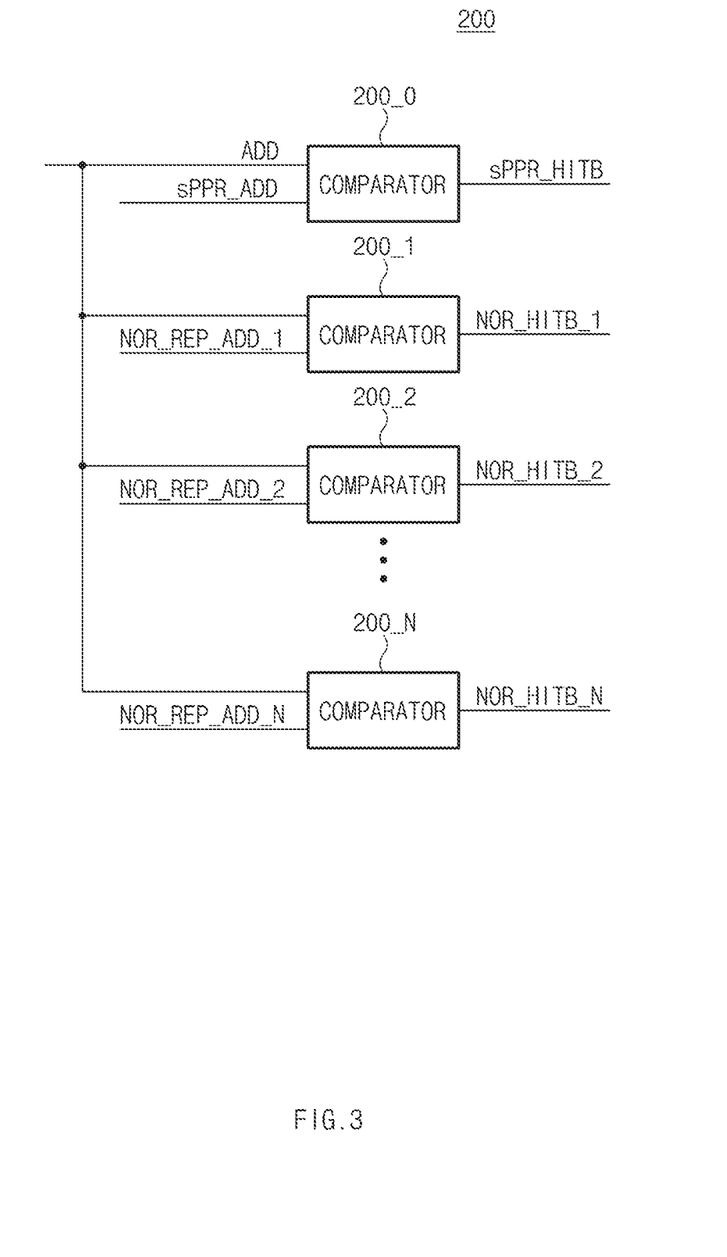
FIG. 3 is a configuration diagram illustrating an example of the address comparison circuit shown in FIG. 1.

FIG. 3 is a configuration diagram illustrating an example of the address comparison circuit 200 shown in FIG. 1.

Referring to FIG. 3, the address comparison circuit 200 includes a plurality of comparators 200_0 to 200_N. Each of the comparators 200_0 to 200_N may be allocated to one of the sPPR address sPPR_ADD and the normal repair addresses NOR_REP_ADD_1 to NOR_REP_ADD_N. For example, the comparators 200_0 to 200_N may be in one-to-one correspondence with the sPPR address sPPR_ADD and the normal repair addresses NOR_REP_ADD_1 to NOR_REP_ADD_N.

The comparator 200_0 determines whether the sPPR address sPPR_ADD and the input address ADD correspond to each other, and generates the sPPR comparison signal sPPR_HITB. The comparator 200_0 may enable the sPPR comparison signal sPPR_HITB to a low level when the sPPR address sPPR_ADD and the input address ADD correspond to each other, and may disable the sPPR comparison signal sPPR_HITB to a high level when the sPPR address sPPR_ADD and the input address ADD do not correspond to each other. The comparator 200_0 may enable the sPPR comparison signal sPPR_HITB only in the case where the fuse set enable signal FSEN_0 is activated.

The comparators 200_1 to 200_N determine whether the corresponding normal repair addresses NOR_REP_ADD_1 to NOR_REP_ADD_N and the input address ADD correspond to each other, and generate the normal comparison signals NOR_HITB_1 to NOR_HITB_N corresponding to the respective normal repair addresses NOR_REP_ADD_1 to NOR_REP_ADD_N. The comparators 200_1 to 200_N may enable the normal comparison signals NOR_HITB_1 to NOR_HITB_N corresponding to the respective normal repair addresses NOR_REP_ADD_1 to NOR_REP_ADD_N to a low level when the corresponding normal repair addresses NOR_REP_ADD_1 to NOR_REP_ADD_N and the input address ADD correspond to each other, and may disable the normal comparison signals NOR_HITB_1 to NOR_HITB_N corresponding to the respective normal repair addresses NOR_REP_ADD_1 to NOR_REP_ADD_N to a high level when the corresponding normal repair addresses NOR_REP_ADD_1 to NOR_REP_ADD_N and the input address ADD do not correspond to each other. The comparators 200_1 to 200_N may enable the normal comparison signals NOR_HITB_1 to NOR_HITB_N only in the case where the corresponding fuse set enable signals FSEN_1 to FSEN_N are activated.

In the fuse set latch array 100 of FIG. 2, the sPPR address sPPR_ADD and the normal repair address NOR_REP_ADD may be the same. In this regard, if the input address ADD is the same as the sPPR address sPPR_ADD and the normal repair address NOR_REP_ADD, the sPPR comparison signal sPPR_HITB and the normal comparison signal NOR_HITB are activated. In other words, in the present embodiment, in the case where at least two the same repair addresses sPPR_ADD and NOR_REP_ADD are stored in the fuse set latch array 100, both the comparison signals sPPR_HITB and NOR_HITB corresponding to the respective repair addresses sPPR_ADD and NOR_REP_ADD are activated.

Figure 4:
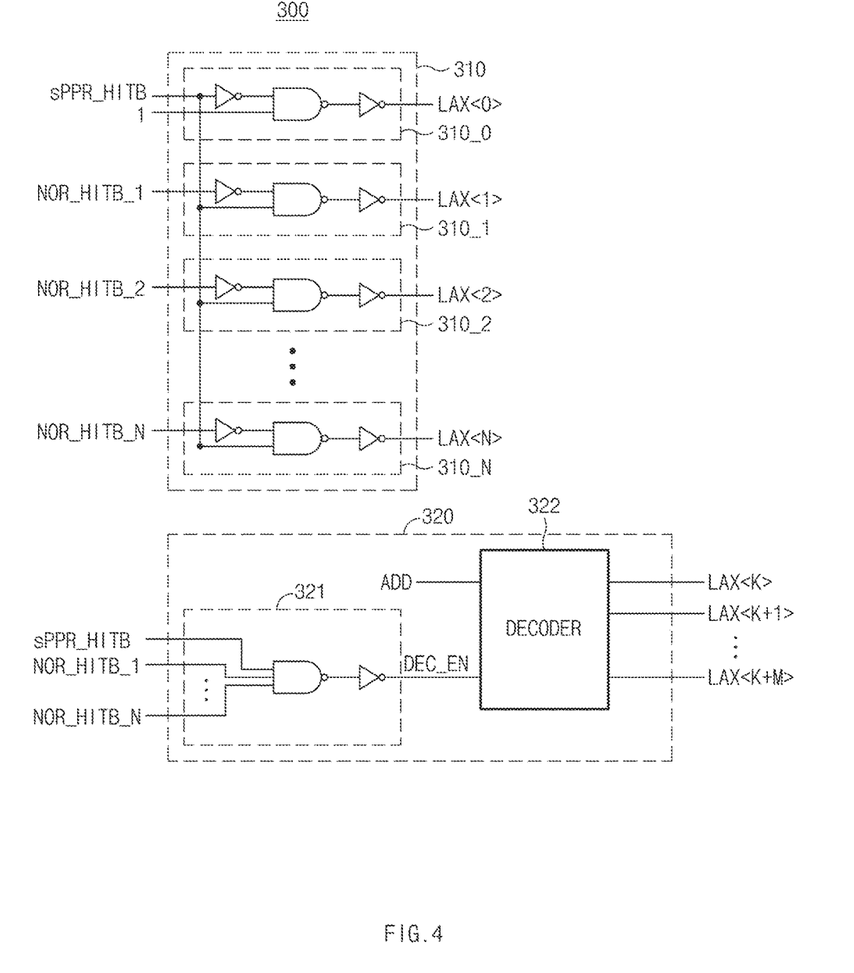
FIG. 4 is a circuit diagram illustrating an example of the word line selection circuit shown in FIG. 1.

FIG. 4 is a detailed circuit diagram illustrating an example of the word line selection circuit 300 shown in FIG. 1.

Referring to FIG. 4, the word line selection circuit 300 generates word line select signals LAX<0> to LAX<N> and LAX<K> to LAX<K+M> based on the sPPR comparison signal sPPR_HITB, the normal comparison signals NOR_HITB_1 to NOR_HITB_N and the input address ADD. The word line selection circuit 300 includes a redundancy word line selection circuit 310, which generates redundancy word line select signals LAX<0> to LAX<N>, and a normal word line selection circuit 320, which generates normal word line select signals LAX<K> to LAX<K+M>.

The redundancy word line selection circuit 310 includes a plurality of redundancy word line selection units 310_0 to 310_N. In an embodiment, each of the comparison signals sPPR_HITB and NOR_HITB_1 to NOR_HITB_N may be allocated to one of redundancy word lines. Likewise, each of the repair addresses sPPR_ADD and NOR_REP_ADD_1 to NOR_REP_ADD_N may be allocated to one of the redundancy word lines. For example, an allocation relationship between the redundancy word lines and the respective repair addresses sPPR_ADD and NOR_REP_ADD_1 to NOR_REP_ADD_N may be set in advance. For example, a certain redundancy word line may be allocated to the sPPR address sPPR_ADD by using the redundancy word line select signal LAX<0>, and the other redundancy word lines may be allocated to the normal repair addresses NOR_REP_ADD_1 to NOR_REP_ADD_N by using the redundancy word line select signals LAX<1> to LAX<N>, respectively.

The redundancy word line selection unit 310_0 includes an inverter that receives the sPPR comparison signal sPPR_HITB, a NAND operator that performs a NAND logic function on an output of the inverter and a logic high value ("1"), and an inverter that is coupled to an output terminal of the NAND operator.

The redundancy word line selection unit 310_0 activates the redundancy word line select signal LAX<0> when the input address ADD and the sPPR address sPPR_ADD correspond to each other and thus the sPPR comparison signal sPPR_HITB is activated. The word line driving device 30 drives the redundancy word line corresponding to the redundancy word line select signal LAX<0> as the redundancy word line select signal LAX<0> is activated.

Each of the redundancy word line selection units 310_1 to 310_N includes an inverter that receives a corresponding one of the normal comparison signals NOR_HITB_1 to NOR_HITB_N, a NAND operator that performs a NAND logic function on an output of the inverter and the sPPR comparison signal sPPR_HITB, and an inverter that is coupled to an output terminal of the NAND operator.

Each of the redundancy word line selection units 310_1 to 310_N activates a corresponding one of the redundancy word line select signals LAX<1> to LAX<N> only in the case where the sPPR comparison signal sPPR_HITB is not activated even though the input address ADD and a corresponding one of the normal repair addresses NOR_REP_ADD_1 to NOR_REP_ADD_N correspond to each other and thus a corresponding one of the normal comparison signals NOR_HITB_1 to NOR_HITB_N is activated. That is to say, each of the redundancy word line selection units 310_1 to 310_N activates a corresponding one of the redundancy word line select signals LAX<1> to LAX<N> only in the case where a corresponding one of the normal comparison signals NOR_HITB_1 to NOR_HITB_N is enabled to the low level and the sPPR comparison signal sPPR_HITB is disabled to the high level. Therefore, for example, in the case where the sPPR address sPPR_ADD and the normal repair address NOR_REP_ADD_1 stored in the fuse set latch array 100 are the same and the input address ADD corresponds to not only the sPPR address sPPR_ADD but also the normal repair address NOR_REP_ADD_1, only the redundancy word line select signal LAX<0> corresponding to the sPPR address sPPR_ADD is activated to prevent two or more redundancy word lines from being activated at the same time.

Thus, in an embodiment, in the case where both the sPPR comparison signal sPPR_HITB and the normal comparison signal NOR_HITB are activated, only the redundancy word line corresponding to the sPPR comparison signal sPPR_HITB, that is, the sPPR address sPPR_ADD may be activated. As a result, it is possible to prevent an address collision in repair operations when the redundancy word lines respectively corresponding to the sPPR comparison signal sPPR_HITB and the normal comparison signal NOR_HITB are activated.

The normal word line selection circuit 320 activates a normal word line select signal (any one of the normal word line select signals LAX<K> to LAX<K+M>) corresponding to the input address ADD in the case where the input address ADD does not correspond to all of the plurality of repair addresses sPPR_ADD and NOR_REP_ADD_1 to NOR_REP_ADD_N.

Referring to FIG. 4, the normal word line selection circuit 320 may include a decoder enable signal generation circuit 321 and a decoder 322.

The decoder enable signal generation circuit 321 includes a NAND operator and an inverter of the comparison signals sPPR_HITB and NOR_HITB_1 to NOR_HITB_N, and activates a decoder enable signal DEC_EN in the case where all of the comparison signals sPPR_HITB and NOR_HITB_1 to NOR_HITB_N are deactivated. [0057] The decoder 420 activates a normal word line select signal (any one of the normal word line select signals LAX<K> to LAX<K+M>) corresponding to a value that is obtained by decoding the input address ADD, in response to the decoder enable signal DEC_EN. The word line driving device 30 drives a normal word line corresponding to the activated normal word line select signal (any one of the normal word line select signals LAX<K> to LAX<K+M>).

In other words, if the input address ADD corresponds to a failed address (i.e., the repair address REP_ADD), the word line selection circuit 300 activates any one of the redundancy word line select signals LAX<0> to LAX<N> corresponding to the repair address REP_ADD. If the input address ADD does not correspond to the repair address REP_ADD, the word line selection circuit 300 activates any one of the normal word line select signals LAX<K> to LAX<K+M> corresponding to the input address ADD. If the input address ADD corresponds to both the sPPR address sPPR_ADD and the normal repair address NOR_REP_ADD, the word line selection circuit 300 activates the redundancy word line select signal LAX<0> corresponding to the sPPR address sPPR_ADD. In activating the redundancy word line select signals LAX<0> to LAX<N>, the redundancy word line select signal LAX<0> allocated to the sPPR address sPPR_ADD may take priority over the other redundancy word line select signals LAX<1> to LAX<N>.

Referring again to FIG. 1, the word line driving device 30 drives the word line driving signal MWLB corresponding to the word line select signal LAX. Because only one word line select signal LAX is activated, one word line driving signal MWLB corresponding thereto may be driven, and accordingly, only one word line may be activated.

Figure 5:
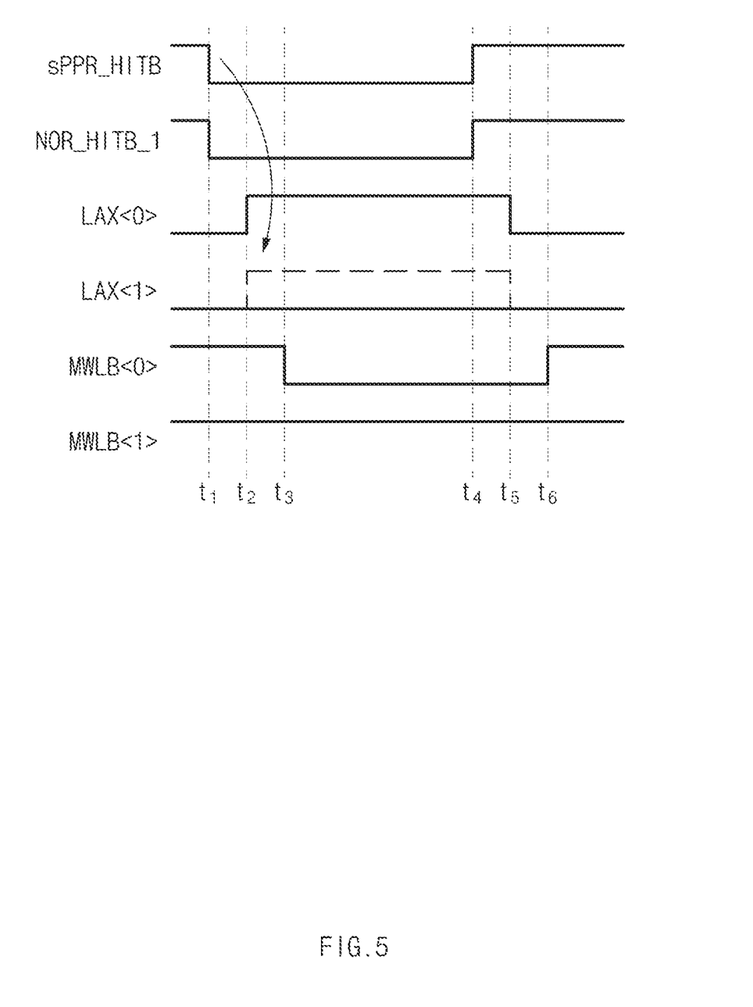
FIG. 5 is a timing diagram illustrating an example of respective signals in accordance with an embodiment.

FIG. 5 is a timing diagram illustrating an example of the respective signals in accordance with an embodiment. In FIG. 5, it is assumed that the input address ADD, the sPPR address sPPR_ADD, and the normal repair address NOR_REP_ADD_1 are the same.

Referring to FIG. 5, at a time t1, since the input address ADD and the sPPR address sPPR_ADD are the same, the comparator 200_0 of the address comparison circuit 200 enables the sPPR comparison signal sPPR_HITB to the low level, and, since the input address ADD and the normal repair address NOR_REP_ADD_1 are the same, the comparator 200_1 of the address comparison circuit 200 enables the normal comparison signal NOR_HITB_1 to the low level.

At a time t2, as the sPPR comparison signal sPPR_HITB is enabled to the low level, the redundancy word line selection unit 310_0 of the word line selection circuit 300 enables the redundancy word line select signal LAX<0> to a high level. Also, as the sPPR comparison signal sPPR_HITB is enabled to the low level and the normal comparison signal NOR_HITB_1 is enabled to the low level, the redundancy word line selection unit 310_1 of the word line selection circuit 300 retains the state of the redundancy word line select signal LAX<1> which is disabled to a low level.

At a time t3, a redundancy word line driving signal MWLB<0> corresponding to the redundancy word line select signal LAX<0> is enabled to a low level, and a redundancy word line driving signal MWLB<1> corresponding to the redundancy word line select signal LAX<1> remains disabled at a high level.

At a time t4 when a predetermined time has passed since the time t1, the sPPR comparison signal sPPR_HITB and the normal comparison signal NOR_HITB_1 are disabled to the high level. A period of time between the time t1 and the time t4 may correspond to a time for which a word line retains an active state.

At a time t5, the redundancy word line select signal LAX<0> corresponding to the sPPR comparison signal sPPR_HITB is disabled to the low level. The redundancy word line select signal LAX<1> corresponding to the normal comparison signal NOR_HITB_1 remains disabled at the low level.

At a time t6, the redundancy word line driving signal MWLB<0> corresponding to the redundancy word line select signal LAX<0> is disabled to the high level, and the redundancy word line driving signal MWLB<1> corresponding to the redundancy word line select signal LAX<1> remains disabled at the high level.

As indicated by a dotted line in FIG. 5, in an embodiment, in the case where the sPPR address sPPR_ADD and the normal repair address NOR_REP_ADD_1 are the same and thus the input address ADD corresponds to not only the sPPR address sPPR_ADD but also the normal repair address NOR_REP_ADD_1, only the redundancy word line select signal LAX<0> corresponding to the sPPR address sPPR_ADD is activated to prevent two or more redundancy word lines from being activated at the same time.

According to the embodiments, in the case where a repair address is stored a multitude of times, only a word line indicated by a redundancy address corresponding to a repair address stored at a position which has a priority is activated, whereby it is possible to prevent a plurality of word lines from being activated unintentionally.

While various embodiments have been described above, it will be understood to those skilled in the art that the embodiments described are by way of example only. Accordingly, the semiconductor device and the semiconductor system including the same described herein should not be limited based on the described embodiments.

For reference, embodiments including additional component elements, which are not directly associated with the technical spirit of the present invention, may be exemplified in order to describe the present inventive concept in further detail. Moreover, an active high configuration or an active low configuration for indicating the activated states of signals and circuits may vary depending upon an embodiment. Furthermore, the configurations of transistors may be changed as the occasion demands in order to realize the same function. Since these circuit changes have a large number of cases and can be easily inferred by those skilled in the art, the enumeration thereof will be omitted herein.

What is claimed is:

1. A semiconductor device comprising:
    a repair address storage circuit suitable for storing a first repair address and a second repair address;
    an address comparison circuit suitable for generating a first comparison signal by comparing an input address and the first repair address, and generating a second comparison signal by comparing the input address and the second repair address; and
    a word line selection circuit suitable for generating a first redundancy word line select signal corresponding to the first comparison signal and a second redundancy word line select signal corresponding to the second comparison signal, based on the first comparison signal and the second comparison signal.

2. The semiconductor device according to claim 1, further comprising:
    a nonvolatile memory circuit suitable for storing the second repair address,
    wherein the repair address storage circuit receives the second repair address from the nonvolatile memory circuit and stores the second repair address in the repair address storage circuit.

3. The semiconductor device according to claim 2, wherein the first repair address is input from an external device coupled to the semiconductor device.

4. The semiconductor device according to claim 3, wherein the first repair address is stored in the repair address storage circuit by using a mode register command.

5. The semiconductor device according to claim 1, wherein the address comparison circuit comprises:
    a first comparator suitable for generating the first comparison signal by comparing the input address and the first repair address; and
    a second comparator suitable for generating the second comparison signal by comparing the input address and the second repair address.

6. The semiconductor device according to claim 1, wherein the word line selection circuit comprises:
    a redundancy word line selection circuit suitable for generating the first redundancy word line select signal and the second redundancy word line select signal; and
    a normal word line selection circuit suitable for generating a normal word line select signal based on the input address.

7. The semiconductor device according to claim 6, wherein the redundancy word line selection circuit activates the first redundancy word line select signal in the case where the first comparison signal is activated, regardless of whether or not the second comparison signal is activated.

8. The semiconductor device according to claim 6, wherein the redundancy word line selection circuit activates the second redundancy word line select signal in the case where the second comparison signal is activated and the first comparison signal is deactivated.

9. The semiconductor device according to claim 6, wherein the normal word line selection circuit comprises:
   a decoder enable signal generation circuit suitable for generating a decoder enable signal based on the first comparison signal and the second comparison signal; and
   a decoder suitable for generating the normal word line select signal in response to the decoder enable signal.

10. The semiconductor device according to claim 9, wherein the decoder enable signal generation circuit activates the decoder enable signal in the case where both the first comparison signal and the second comparison signal are deactivated.

11. The semiconductor device according to claim 9, wherein the decoder activates the normal word line select signal corresponding to a value obtained by decoding the input address.

12. A semiconductor system comprising:
   a semiconductor device suitable for generating a first redundancy word line select signal corresponding to a first repair address, which is provided to the semiconductor device, and a second redundancy word line select signal corresponding to a second repair address, which is recorded in the semiconductor device, based on a result of comparing an input address with each of the first repair address and the second repair address; and
   a controller suitable for storing the first repair address in the semiconductor device.

13. The semiconductor system according to claim 12, wherein the semiconductor device comprises:
   a repair address storage circuit suitable for storing the first repair address and the second repair address;
   an address comparison circuit suitable for generating a first comparison signal by comparing the input address and the first repair address stored in the repair address storage circuit, and generating a second comparison signal by comparing the input address and the second repair address stored in the repair address storage circuit; and
   a word line selection circuit suitable for generating the first redundancy word line select signal corresponding to the first comparison signal and the second redundancy word line select signal corresponding to the second comparison signal, based on the first comparison signal and the second comparison signal.

14. The semiconductor system according to claim 13, wherein the controller stores the first repair address in the repair address storage circuit by transmitting a mode register command to the semiconductor device.

15. The semiconductor system according to claim 13, wherein the word line selection circuit comprises:
   a redundancy word line selection circuit suitable for generating the first redundancy word line select signal and the second redundancy word line select signal; and
   a normal word line selection circuit suitable for generating a normal word line select signal based on the input address.

16. The semiconductor system according to claim 15, wherein the redundancy word line selection circuit activates the first redundancy word line select signal in the case where the first comparison signal is activated, regardless of whether or not the second comparison signal is activated.

17. The semiconductor system according to claim 15, wherein the redundancy word line selection circuit activates the second redundancy word line select signal in the case where the second comparison signal is activated and the first comparison signal is deactivated.

18. The semiconductor system according to claim 15, wherein the normal word line selection circuit comprises:
   a decoder enable signal generation circuit suitable for generating a decoder enable signal based on the first comparison signal and the second comparison signal; and
   a decoder suitable for generating the normal word line select signal in response to the decoder enable signal.

19. The semiconductor system according to claim 18, wherein the decoder enable signal generation circuit activates the decoder enable signal in the case where both the first comparison signal and the second comparison signal are deactivated.

20. The semiconductor system according to claim 18, wherein the decoder activates the normal word line select signal corresponding to a value obtained by decoding the input address.

* * * * *